United States Patent
Kondo

(10) Patent No.: US 10,305,017 B2
(45) Date of Patent: May 28, 2019

(54) PIEZOELECTRIC SENSOR

(71) Applicant: Murata Manufacturing Co., Ltd., Kyoto (JP)

(72) Inventor: Nobuhiro Kondo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 575 days.

(21) Appl. No.: 15/074,430

(22) Filed: Mar. 18, 2016

(65) Prior Publication Data

US 2016/0204333 A1 Jul. 14, 2016

Related U.S. Application Data

(63) Continuation of application No. PCT/JP2014/073141, filed on Sep. 3, 2014.

(30) Foreign Application Priority Data

Sep. 20, 2013 (JP) .................... 2013-195408

(51) Int. Cl.
*H01L 41/04* (2006.01)
*H01L 41/047* (2006.01)
(Continued)

(52) U.S. Cl.
CPC .......... *H01L 41/04* (2013.01); *H01L 41/0471* (2013.01); *H01L 41/0533* (2013.01);
(Continued)

(58) Field of Classification Search
CPC ..... H01L 41/047; H01L 41/113; H01L 41/083
See application file for complete search history.

(56) References Cited

U.S. PATENT DOCUMENTS 4,310,730 A * 1/1982 Aaroe ...................... H04R 1/46
188/268
4,491,051 A * 1/1985 Barcus ................... G10H 3/143
84/728
(Continued)

FOREIGN PATENT DOCUMENTS

JP    H08-75575 A    3/1996
JP    2006-253416 A  9/2006
(Continued)

OTHER PUBLICATIONS

International Search Report issued in Application No. PCT/JP2014/073141 dated Oct. 7, 2014.
(Continued)

*Primary Examiner* — J. San Martin
(74) *Attorney, Agent, or Firm* — Pearne & Gordon LLP

(57) ABSTRACT

The present disclosure provides a highly sensitive piezoelectric sensor in which mixing of electromagnetic noise into signals output from a piezoelectric device is suppressed. The present disclosure provides a piezoelectric sensor including a piezoelectric device which includes a piezoelectric film having an insulating film and a piezoelectric layer stacked on one principal surface of the insulating film and a signal electrode layer stacked on one principal surface of the piezoelectric film, an amplifier electrically connected to the signal electrode layer, and a shield member which is not electrically connected to the signal electrode layer and is composed of a grounded conductor, wherein the piezoelectric film, the signal electrode layer, and the amplifier are accommodated inside the shield member.

5 Claims, 4 Drawing Sheets

(51) Int. Cl.
  *H01L 41/083* (2006.01)
  *H01L 41/311* (2013.01)
  *H04R 17/02* (2006.01)
  *H01L 41/053* (2006.01)
  *H01L 41/113* (2006.01)
  *H04R 1/08* (2006.01)

(52) U.S. Cl.
  CPC ........ *H01L 41/083* (2013.01); *H01L 41/1132* (2013.01); *H01L 41/311* (2013.01); *H04R 17/025* (2013.01); H01L 41/0475 (2013.01); H04R 1/086 (2013.01)

(56) References Cited

U.S. PATENT DOCUMENTS

| | | | | |
|---|---|---|---|---|
| 4,549,089 A | * | 10/1985 | Buetemeister | F02N 11/0848 290/38 R |
| 2003/0146675 A1 | * | 8/2003 | Cuhat | H01L 41/047 310/319 |
| 2005/0072216 A1 | * | 4/2005 | Engel | G01F 1/20 73/53.01 |
| 2008/0061969 A1 | * | 3/2008 | Okude | G08B 13/10 340/541 |
| 2008/0279407 A1 | | 11/2008 | Pahl | |
| 2011/0186943 A1 | | 8/2011 | Pahl | |
| 2018/0017386 A1 | * | 1/2018 | Mitani | G01C 19/5677 |

FOREIGN PATENT DOCUMENTS

JP  2009-514691 A  4/2009
JP  2009-515443 A  4/2009

OTHER PUBLICATIONS

Written Opinion issued in Application No. PCT/JP2014/073141 dated Oct. 7, 2014.

* cited by examiner

PIEZOELECTRIC SENSOR

BACKGROUND OF THE DISCLOSURE

Field of the Disclosure

The present disclosure relates to a piezoelectric sensor.

Description of the Related Art

A structure in which a piezoelectric layer is sandwiched between two electrode layers is known to be the structure of a general piezoelectric device used for sensors, actuators, and the like. In the piezoelectric device, physical signals, e.g., stress, applied to the piezoelectric device are converted to electric signals (direct piezoelectric effect) and are output from the electrodes, or electric signals input into the piezoelectric device are converted to physical signals (inverse piezoelectric effect).

In recent years, miniaturization and weight reduction of piezoelectric devices used for sensors and the like have been required in accordance with the miniaturization of electronic equipment. In order to address this requirement, development of a piezoelectric device in which a thin film piezoelectric layer is disposed on a film-shaped base material or a piezoelectric device composed of a film material having a piezoelectric property has been conducted.

Such a piezoelectric device has high impedance and is susceptible to noise. Therefore, for the purpose of eliminating electromagnetic noise and increasing sensitivity, enhancement of a shielding effect of the piezoelectric device has been proposed.

For example, Patent Document 1 (Japanese Unexamined Patent Application Publication No. 2006-253416) discloses a switching device (piezoelectric device) having a structure in which piezoelectric layers 3 and 3' and substrates 2 and 2' (insulating films) are stacked on both sides of an inner electrode layer 4 and are shielded by outer electrode layers 5 and 5'. In this regard, a hole (energization window) 6 is disposed in the outer electrode layer 5' and the like, and signals are output from the inner electrode layer 4 (refer to FIGS. 2A and 2B and the like).

In addition, Patent Document 2 (Japanese Unexamined Patent Application Publication No. 8-75575) discloses a piezoelectric sensor having a structure in which electrodes 10 and 11 are disposed on both surfaces of a piezoelectric material 9 and are shielded by protective layers 12 and 13, shield layers 14 and 15, and insulating layers 16 and 17 in the form of a stacked structure.

Patent Document 1: Japanese Unexamined Patent Application Publication No. 2006-253416

Patent Document 2: Japanese Unexamined Patent Application Publication No. 8-75575

BRIEF SUMMARY OF THE DISCLOSURE

Signals of a piezoelectric device are weak. Therefore, in general, electric signals output from a signal electrode of the piezoelectric device have to be amplified by an amplifier. According to the investigations of the present inventors, even when noise is mixed into signals after amplification by the amplifier, the measurement accuracy of a sensor is less affected. On the other hand, if electromagnetic noise is mixed into signals which have been output from the signal electrode and which occur before amplification by the amplifier, measured values may include large errors, and the measurement accuracy of the sensor may be affected to a great extent.

Accordingly, it is an object of the present disclosure to provide a highly sensitive piezoelectric sensor in which mixing of electromagnetic noise into signals output from a piezoelectric device is suppressed.

The present disclosure provides a piezoelectric sensor including a piezoelectric device which includes a piezoelectric film having an insulating film and a piezoelectric layer stacked on one principal surface of the insulating film or a piezoelectric film composed of a piezoelectric material and a signal electrode layer stacked on the one principal surface of the piezoelectric film, an amplifier electrically connected to the signal electrode layer, and a shield member which is not electrically connected to the signal electrode layer and is composed of a grounded conductor, wherein the piezoelectric film, the signal electrode layer, and the amplifier are accommodated inside the shield member.

Preferably, the piezoelectric sensor further includes an amplifier case which covers at least part of the amplifier and which is not electrically connected to the signal electrode layer and is composed of a grounded conductor, wherein the piezoelectric device further includes a ground electrode layer which covers at least part of the piezoelectric film and the signal electrode layer and which is not electrically connected to the signal electrode layer and is composed of a grounded conductor, and the shield member includes the ground electrode layer and the amplifier case.

Preferably, the amplifier is stacked on the piezoelectric device while being located on the side opposite to the piezoelectric film with reference to the signal electrode layer, and the ground electrode layer has an opening or a notch for electrically connecting the signal electrode layer to the amplifier.

Preferably, the amplifier is stacked on the piezoelectric device with a printed circuit board interposed therebetween.

Preferably, the printed circuit board has, on the principal surface on the piezoelectric device side, a signal input terminal electrically connected to the signal electrode layer and a ground input terminal electrically connected to the ground electrode layer, and the signal input terminal is surrounded by the ground input terminal in the in-plane direction of the principal surface.

According to the present disclosure, a highly sensitive piezoelectric sensor can be provided, wherein mixing of electromagnetic noise into signals output from a piezoelectric device is suppressed.

Figure 2A:
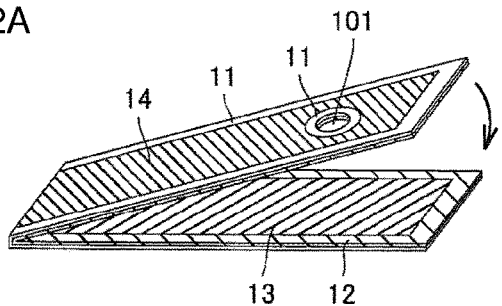
Figure 2B:
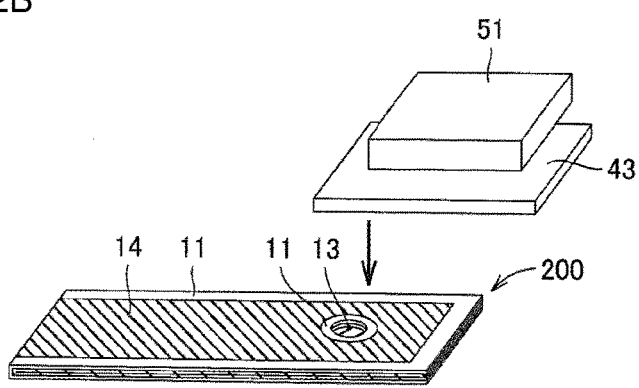

Each of FIGS. 2A and 2B is a schematic diagram illustrating a configuration of a piezoelectric sensor according to a second embodiment.

Figure 3A:
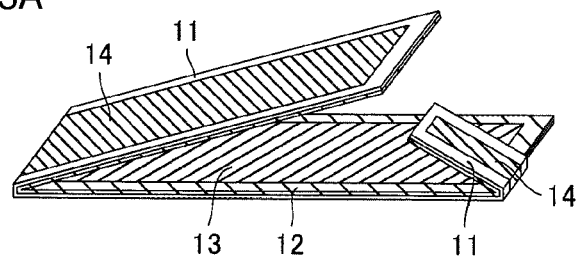
Figure 3B:
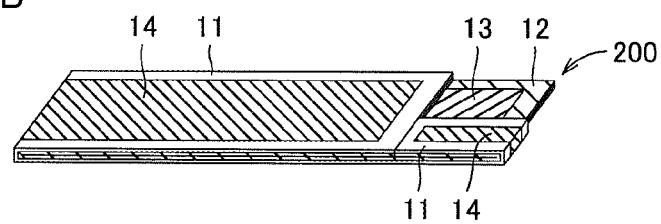

Each of FIGS. 3A and 3B is a schematic diagram illustrating another configuration of the piezoelectric sensor according to the second embodiment.

Figure 4:
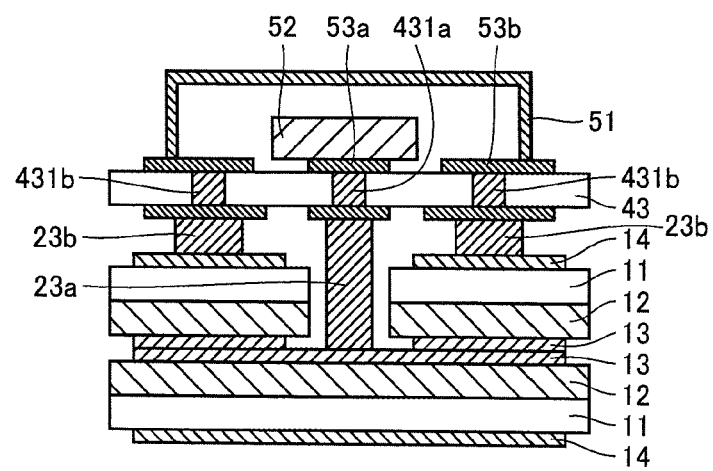

FIG. 4 is a schematic diagram illustrating the configuration of a piezoelectric sensor according to the second embodiment.

Figure 5:
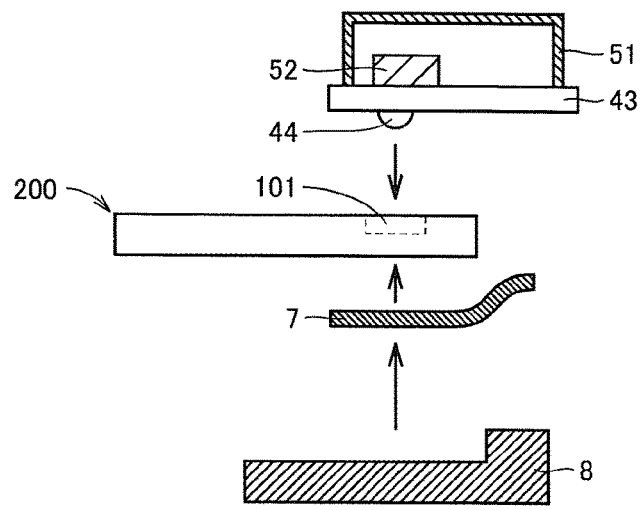

FIG. 5 is a schematic diagram illustrating a configuration of a piezoelectric sensor according to a third embodiment.

Figure 6:
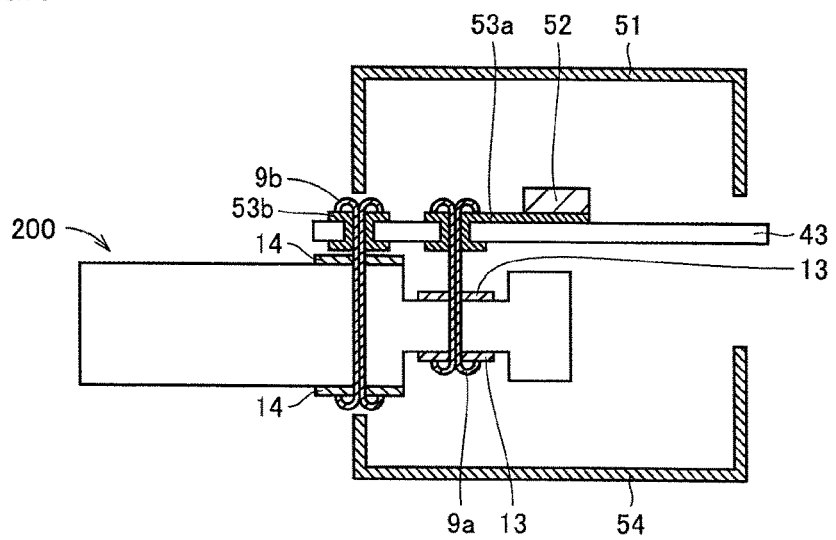

FIG. 6 is a schematic diagram illustrating a configuration of a piezoelectric sensor according to a fourth embodiment.

Figure 7:
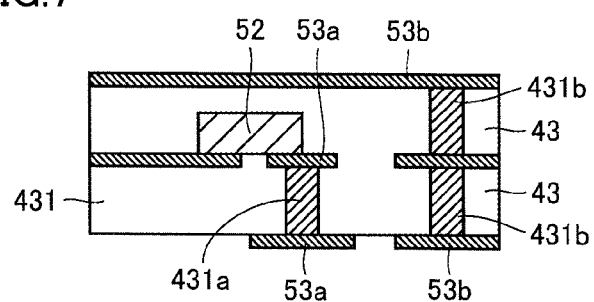

FIG. 7 is a schematic diagram illustrating a configuration of a piezoelectric sensor according to a fifth embodiment.

DETAILED DESCRIPTION OF THE DISCLOSURE

A piezoelectric sensor according to the present disclosure includes a piezoelectric device and an amplifier, and the two are electromagnetically shielded (accommodated inside a shield member which is not electrically connected to a signal electrode layer of the piezoelectric device and is composed of a grounded conductor). In this regard, in the case where the signal electrode of the piezoelectric device is connected to the amplifier by a conductor (amplifier connection conductor), the amplifier connection conductor is also electromagnetically shielded (accommodated inside the shield member). Consequently, mixing of electromagnetic noise into not only signals generated in the piezoelectric layer but also signals which have been output from a signal electrode of the piezoelectric device and which occur before amplification by the amplifier is suppressed. Therefore, a highly sensitive piezoelectric sensor can be provided.

In the present disclosure, the piezoelectric device includes at least a "piezoelectric film" having an insulating film and a piezoelectric layer stacked on one principal surface of the insulating film and a "signal electrode layer" stacked on one principal surface of the piezoelectric film. The "piezoelectric film" may be composed of a film material having a piezoelectric property.

Preferably, the piezoelectric film used for the piezoelectric sensor is a low-profile (film-like) member and the piezoelectric device including the piezoelectric film is also low-profile (film-like). More preferably, the entire piezoelectric sensor is a low-profile (film-like) piezoelectric sensor.

For example, the piezoelectric sensor is used as a sensor for measuring physical signals, e.g., displacement signals and audible signals. The piezoelectric sensor preferably has a high shielding effect for the purpose of eliminating electromagnetic noise and increasing sensitivity. In particular, in the case where physical signals generated in the human body are measured, it is desirable that the shielding effect of the piezoelectric sensor be especially enhanced because the human body is an insulator and picks up induced noise. In this regard, a member having the same configuration as the configuration of the piezoelectric sensor according to the present disclosure can be used as an actuator.

The insulating film is usually a film having flexibility and is preferably a film containing primarily a high polymer having features such as light weight and ease of handling. There is no particular limitation regarding what high polymer may be used as the primary component of the insulating film. Examples thereof include polyimide resins, polyamide resins, polyester resins, and polyolefin resins. Polyimide resins having excellent heat resistance, dielectric breakdown strength, and mechanical strength are preferable.

There is no particular limitation regarding the constituent material for the piezoelectric layer as long as the material has a piezoelectric property. For example, materials containing primarily compounds having a wurtzite structure and complex oxides (perovskite complex oxides) having a perovskite structure ($ABO_3$) can be used.

Examples of compounds having the wurtzite structure include aluminum nitride, gallium nitride, indium nitride, beryllium nitride, zinc oxide, cadmium sulfide, zinc sulfide, and silver iodide.

Regarding the A site of the perovskite structure ($ABO_3$) of the perovskite complex oxide, for example, at least one element selected from Pb, Ba, Ca, Sr, La, Li, and Bi can be adopted. Regarding the B site of the perovskite structure ($ABO_3$), for example, at least one element selected from Ti, Zr, Zn, Ni, Mg, Co, W, Nb, Sb, Ta, and Fe can be adopted.

Specific examples of such perovskite complex oxides include lead zirconate titanate [$Pb(Zr,Ti)O_3$] (may be referred to as PZT), potassium niobate tantalate [$K(Ta,Nb)O_3$], barium titanate ($BaTiO_3$), and $(Pb,La)(Zr,Ti)O_3$ [lead titanate ($PbTiO_3$) and the like].

Regarding the method for forming the piezoelectric layer, for example, a sputtering method, a vacuum evaporation method, a laser abrasion method, an ion plating method, a coating method, and chemical vapor deposition methods, e.g., a CVD method and a MOCVD method, are known, and from these a suitable method can be appropriately selected.

The film thickness of the piezoelectric layer is preferably 0.1 to 100 μm and more preferably 0.5 to 30 μm. That is, if the thickness is less than 0.1 μm, a sufficient output is not obtained easily in use as, for example, a sensor or an actuator. Conversely, if the thickness is more than 100 μm, the flexibility becomes poor and cracking and peeling may occur.

The signal electrode layer is a film-shaped layer composed of an electrode for outputting electric signals generated in the piezoelectric layer and is electrically connected to the amplifier.

Regarding the material for the signal electrode layer, for example, metals, e.g., Al, Ni, Pt, Au, Ag, Ti, Cu, and Sn, electrically conductive materials composed of alloys thereof, and electrically conductive materials containing metal oxides and metal nitrides can be used. These electrically conductive materials can also be used as the material for the conductor constituting the shield member (ground electrode layer and amplifier case).

There is no particular limitation regarding the method of forming the signal electrode layer. For example, a coating treatment, a plating method, a sputtering method, physical vapor deposition methods, e.g., a vacuum evaporation method, can be used. Also, the ground electrode layer can be formed by the same method. The ground electrode layer may be formed by other methods, for example, stacking of thin films composed of the above-described materials.

The amplifier electrically connected to the signal electrode layer has a function of amplifying electric signals from the signal electrode layer, and various known amplifiers used for electronic circuits can be employed.

The shield member is not electrically connected to the signal electrode layer but is composed of a grounded conductor. In this regard, the term "grounded conductor" refers to a conductor (electrical conductor) connected to a reference potential point. There is no particular limitation regarding the shape of the shield member as long as the shape is suitable for accommodating the piezoelectric film, the signal electrode layer, and the amplifier inside. A low-profile shape is preferable.

The embodiments of the piezoelectric device according to the present disclosure will be described below with reference to the drawings. In this regard, in the drawings, the same or equivalent portions are indicated by the same reference numeral. Meanwhile, the dimensional relationships between the length, the width, the thickness, the depth, and the like have been changed appropriately for the purpose of clarifying and simplifying the drawings and, therefore, differ from the actual dimensional relationships.

(First Embodiment)

Figure 1:
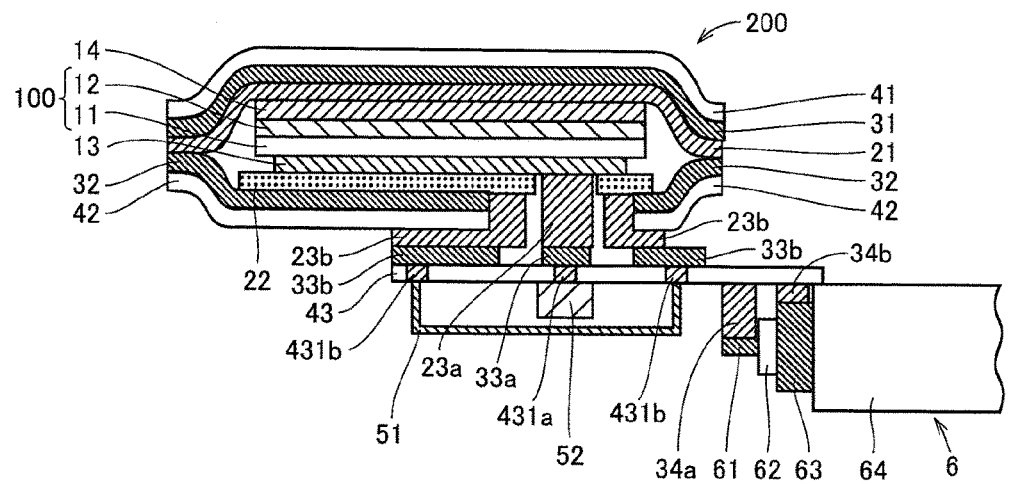
FIG. 1 is a schematic diagram illustrating a configuration of a piezoelectric sensor according to a first embodiment.

FIG. 1 is a schematic diagram illustrating a configuration of a piezoelectric sensor according to a first embodiment.

Referring to FIG. 1, a piezoelectric device 200 constituting part of a piezoelectric sensor according to the present embodiment includes a piezoelectric film 100 having an insulating film 11 and a piezoelectric layer 12 stacked on one principal surface of the insulating film 11, a signal electrode layer 13 stacked on one principal surface of the piezoelectric film 100, and a "ground electrode layer" composed of a first ground electrode layer 14 stacked on the other surface of the piezoelectric film 100, a second ground electrode layer 31 stacked on (electrically connected to) the first ground electrode layer 14 with an electrically conductive adhesive layer 21 interposed therebetween, and a third ground electrode layer 32 electrically connected to the second ground electrode layer 31 with the electrically conductive adhesive layer 21 interposed therebetween. Also, insulating layers 41 and 42 are further stacked on the surfaces of the second ground electrode layer 31 and the third ground electrode layer 32.

The third ground electrode layer 32 is stacked on the signal electrode layer 13 with the insulating adhesive layer 22 interposed therebetween and is not electrically connected to the signal electrode layer 13.

As described above, in the piezoelectric device according to the present embodiment, the "ground electrode layer" composed of conductors (ground electrode layers 14, 31, and 32 and electrically conductive adhesive layer 21), which are not electrically connected to the signal electrode layer and are grounded, is further disposed in addition to the piezoelectric film and the signal electrode layer so as to cover at least the piezoelectric film and the signal electrode layer.

Part of the surface of the signal electrode layer 13 is electrically connected to an amplifier 52 such that an electrically conductive adhesive layer 23a, a signal input terminal 33a, and a via conductor 431a are interposed therebetween. The third ground electrode layer 32 (and an insulating layer 42) has an opening therefor. The amplifier 52 is electrically connected to a signal output terminal 34a such that a wire (not shown in the drawing) in a printed circuit board 43 is interposed therebetween, the signal output terminal 34a is electrically connected to an internal conductor 61 of a coaxial cable 6, and signals amplified by the amplifier 52 are output through the coaxial cable 6.

Meanwhile, the third ground electrode layer 32 is electrically connected to a ground input terminal 33b with an electrically conductive adhesive layer 23b interposed therebetween. The ground input terminal 33b is electrically connected to an amplifier case 51, which covers the amplifier 52, with a via conductor 431b interposed therebetween and is further electrically connected to a ground output terminal 34b such that a wire (not shown in the drawing) in the printed circuit board 43 is interposed therebetween. The ground output terminal 34b is electrically connected to an external conductor 63 of the coaxial cable 6 so as to be grounded. The coaxial cable 6 is insulated by insulators 62 and 64. In this regard, signals after amplification by the amplifier are not affected by noise easily and, therefore, other various wires may be used instead of the coaxial cable 6.

In this manner, in the present embodiment, the amplifier 52 is not electrically connected to the signal electrode layer 13 but is covered with the amplifier case 51 composed of a grounded conductor.

As described above, in the present embodiment, the piezoelectric film 100, the signal electrode layer 13, and the amplifier 52 are accommodated inside a "shield member" composed of the "ground electrode layer" including the ground electrode layers 14, 31, and 32 and the electrically conductive adhesive layer 21, the amplifier case 51, and members for electrically connecting the "ground electrode layer" to the amplifier case 51 (electrically conductive adhesive layer 23b, ground input terminal 33b, and via conductor 431b). Consequently, mixing of electromagnetic noise into not only signals generated in the piezoelectric layer but also signals which have been output from the signal electrode of the piezoelectric device and which occur before amplification by the amplifier is suppressed.

In this regard, it is not necessary that the entirety of the piezoelectric film 100 and the signal electrode layer 13 be covered with only the ground electrode layers 14, 31, and 32, and the entirety of amplifier 52 be covered with only the amplifier case 51. The only requirement is that the piezoelectric film 100, the signal electrode layer 13, and the amplifier 52 are accommodated inside the "shield member" including the ground electrode layers 14, 31, and 32 and the amplifier case 51.

In the case where the piezoelectric device is connected to the amplifier by a signal line (wire or the like) separately, the shield member is upsized. However, in the present embodiment, a separate signal line is unnecessary because the piezoelectric device having the above-described configuration is connected to the amplifier with the printed circuit board 43 interposed therebetween by stacking. Consequently, a small (low-profile) shield-integrated piezoelectric sensor can be provided inexpensively.

In this regard, it is considered to use the piezoelectric device and the amplifier which are shielded separately. However, in order to connect the two while the shielded state is maintained, it is necessary to use a coaxial cable having an electromagnetic shielding effect. On the other hand, in the present disclosure, the entirety of the piezoelectric device and the amplifier (including the connection conductor between the piezoelectric device and the amplifier) is electromagnetically shielded. Therefore, it is unnecessary to use a special wire, e.g., a coaxial cable, for connecting the piezoelectric device to the amplifier, various forms of connection, e.g., connection by interposing a printed circuit board, can be employed, and there is an advantage that the scope of selection of the configuration of the piezoelectric sensor is broaden.

Also, in the present embodiment, the signal input terminal 33a is surrounded by the ground input terminal 33b in the in-plane direction of the principal surface of the printed circuit board 43. Therefore, the shielding effect is further enhanced.

Also, the electrically conductive adhesive layer 23a is connected to the signal input terminal 33a disposed on the rigid printed circuit board. The ground input terminal 33b is disposed so as to surround the signal input terminal 33a and, therefore, there is an advantage that the stress is relaxed and the risk of break in the signal line composed of the electrically conductive adhesive layer 23a and the signal input terminal 33a is reduced.

(Second Embodiment)

Each of FIGS. 2A and 2B is a schematic diagram illustrating a configuration of a piezoelectric sensor according to a second embodiment. Also, FIG. 4 is a schematic diagram of a vertical section including an opening 101 shown in FIGS. 2A and 2B.

As shown in FIG. 2A, a multilayer body, in which a signal electrode layer 13, a piezoelectric layer 12, an insulating film 11, and a ground electrode layer 14 are stacked in that order, is folded with the signal electrode layer 13 inner side (in such a way that an end portion of a surface of the signal electrode layer 13 comes into contact with the other end portion of the surface) so as to produce a piezoelectric device 200 (FIG. 2B) used in the present embodiment.

Here, the multilayer body has an opening 101 and part of the signal electrode layer 13 is in the state of being exposed at the opening 101 after the multilayer body is folded (FIG. 2B). Meanwhile, a piezoelectric film (piezoelectric layer 12 and insulating film 11) and the signal electrode layer 13 are covered with the ground electrode layer 14.

As shown in FIG. 2B, a ground electrode layer 14 equipped with an amplifier case 51 with a built-in amplifier is stacked on the resulting piezoelectric device and, thereby, as shown in FIG. 4, the amplifier 52 in the amplifier case 51 is connected to the surface, which is exposed at the opening 101, of the signal electrode layer 13 by the electrically conductive adhesive layer 23a, a signal wire 53a disposed on the printed circuit board 43, and a via conductor 431a disposed in the printed circuit board 43.

Meanwhile, the ground electrode layer 14 is grounded by the electrically conductive adhesive layer 23b, a ground wire 53b disposed on the printed circuit board 43, and a via conductor 431b disposed in the printed circuit board 43.

The same effects as the effects in the first embodiment are exhibited in the present embodiment. Also, in the present embodiment, the number of components and the number of man-hours required for assembly in the production of the piezoelectric device 200 can be reduced and the production cost can be reduced by adopting the structure, in which the ground electrode layer 14 in the outer side portion covers the piezoelectric film (insulating film 11 and piezoelectric layer 12) and the signal electrode layer 13, in the piezoelectric device after the multilayer body including the piezoelectric film and the electrode layer is folded.

In this regard, a piezoelectric device 200 (FIG. 3B) obtained by folding a multilayer body having a notch at an end portion, as shown in FIG. 3A, can be used instead of the piezoelectric device 200 (FIG. 2B) obtained by folding the multilayer body having the opening 101, as shown in FIG. 2A. However, in order to enhance the shielding effect of the connection portion between the signal electrode layer 13 and the amplifier, it is preferable that the ground electrode layer 14 (and insulating film 11) having the opening 101, as shown in FIGS. 2A and 2B, be used.

(Third Embodiment)

FIG. 5 is a schematic diagram illustrating the configuration of a piezoelectric sensor according to a third embodiment.

In the present embodiment, for example, the same piezoelectric device as the piezoelectric device 200 described with reference to FIGS. 2A and 2B in the second embodiment is used. As shown in FIG. 5, an electrically conductive bump 44 is disposed on a portion, which corresponds to the opening 101 of the piezoelectric device 200, of a printed circuit board 43 equipped with an amplifier case 51 with a built-in amplifier 52. The bump 44 also serves as a signal input terminal of the printed circuit board 43.

The printed circuit board 43 is stacked on one surface of the piezoelectric device 200, an electrically conductive adhesive tape 7 is stacked on the other surface, and thermocompression bonding is performed by a thermocompression bonding machine. Consequently, a signal electrode layer inside the piezoelectric device 200 is electrically connected to the bump 44, and the ground electrode layer in the outer side portion of the piezoelectric device 200 is electrically connected to a ground input terminal (or ground wire) of the printed circuit board 43 with the electrically conductive adhesive tape 7 interposed therebetween.

In this manner, the same signal electrode layer of the piezoelectric device as that in the second embodiment can be electrically connected to the amplifier with the electrically conductive bump interposed therebetween. Also, the ground electrode layer can be connected to the amplifier case with the electrically conductive adhesive tape interposed therebetween.

The present embodiment has an advantage that thermal stress related to connection is small and a piezoelectric film having low heat resistance can be used compared with the first embodiment.

(Fourth Embodiment)

FIG. 6 is a schematic diagram illustrating a configuration of a piezoelectric sensor according to a fourth embodiment.

In the present embodiment, for example, the same piezoelectric device as the piezoelectric device 200 described with reference to FIGS. 2A and 2B in the second embodiment is used. Then, as shown in FIG. 6, a printed circuit board 43 equipped with an amplifier case 51 with a built-in amplifier 52 is stacked on one surface of the piezoelectric device 200, and the printed circuit board 43 and the piezoelectric device 200 are firmly fixed by using crimps 9a and 9b.

A signal wire 53a of the printed circuit board 43 is electrically connected to the signal electrode layer 13 of the piezoelectric device 200 by using the crimp 9a. Also, the ground wire 53b of the printed circuit board 43 is electrically connected to the ground electrode layer 14 of the piezoelectric device 200 by using the crimp 9b. In this regard, FIG. 6 is a sectional view and, therefore, the amplifier case 51 and the printed circuit board 43 seem to be spaced. However, the amplifier case 51 is connected to the ground wire 53b of the printed circuit board 43 in some other portion.

Further, in the present embodiment, as shown in FIG. 6, a shield case 54 similar to the amplifier case 51 is stacked on the other surface of the piezoelectric device 200. In this regard, FIG. 6 is a sectional view and, therefore, the shield case 54 and the printed circuit board 43 seem to be spaced. However, the shield case 54 is connected to the ground electrode layer 14 of the piezoelectric device 200 in some other portion.

In this manner, the signal electrode layer of the piezoelectric device similar to that in the second embodiment can be electrically connected to the amplifier by using a crimp. Also, the ground electrode layer can be connected to an amplifier case by using a crimp.

The present embodiment has an advantage that the strength of the connection portion is enhanced compared with the first embodiment and the third embodiment.

(Fifth Embodiment)

FIG. 7 is a schematic diagram illustrating a configuration of a piezoelectric sensor according to a fifth embodiment.

In the present embodiment, for example, the same piezoelectric device as the piezoelectric device 200 described with reference to FIGS. 2A and 2B in the second embodiment is used. Then, the piezoelectric sensor according to the present embodiment is obtained by stacking such a piezoelectric device on a resin multilayer substrate, which is produced by stacking a plurality of printed circuit boards 43, with a built-in amplifier 52, as shown in FIG. 7.

The amplifier 52 built in the resin multilayer substrate is electrically connected to a signal electrode layer of the piezoelectric device such that a signal wire 53*a* and a via conductor 431*a* are interposed therebetween. Also, a ground electrode layer of the piezoelectric device is electrically connected to a ground wire 53*b* of the resin multilayer substrate and a via conductor 431*b* so as to be grounded.

According to the present embodiment, the piezoelectric sensor can be further miniaturized and made low-profile by using the resin multilayer substrate with the built-in amplifier.

It should be understood that the embodiments disclosed above are no more than examples in all points and are not limitative. The scope of the present disclosure is not shown by the above-described explanation but is shown by the claims, and it is intended that the disclosure covers various modifications within the scope of the claims and equivalents thereof.

The invention claimed is:

1. A piezoelectric sensor comprising:
   a piezoelectric device including a piezoelectric film and a signal electrode layer, wherein the piezoelectric film has an insulating film and a piezoelectric layer stacked on the insulating film, and wherein the signal electrode layer is stacked on one surface of the piezoelectric film;
   an amplifier electrically connected to the signal electrode layer; and
   a shield member not electrically connected to the signal electrode layer and composed of a ground electrode layer and an amplifier case, wherein the ground electrode layer is stacked on another surface of the piezoelectric film opposite to the one surface of the piezoelectric film,
   wherein the piezoelectric film and the signal electrode layer are accommodated inside the ground electrode layer, and the amplifier is accommodated inside the amplifier case.

2. The piezoelectric sensor according to claim 1, wherein the amplifier case is not electrically connected to the signal electrode layer and composed of a grounded conductor,
   wherein the ground electrode layer is not electrically connected to the signal electrode layer and composed of a grounded conductor.

3. The piezoelectric sensor according to claim 2,
   wherein the amplifier is stacked on the piezoelectric device at a side opposite to the piezoelectric film when viewed from the signal electrode layer, and
   wherein the ground electrode layer has an opening or a notch for electrically connecting the signal electrode layer to the amplifier.

4. The piezoelectric sensor according to claim 3, wherein the amplifier is stacked on the piezoelectric device through a printed circuit board interposed therebetween.

5. The piezoelectric sensor according to claim 4,
   wherein the printed circuit board has, at a side of a principal surface of the printed circuit board facing to the piezoelectric device,
   a signal input terminal electrically connected to the signal electrode layer and
   a ground input terminal electrically connected to the ground electrode layer, and
   wherein the signal input terminal is surrounded by the ground input terminal in an in-plane direction of the principal surface of the printed circuit board.

* * * * *